United States Patent
Mao et al.

(10) Patent No.: US 6,169,647 B1
(45) Date of Patent: Jan. 2, 2001

(54) GIANT MAGNETORESISTIVE SENSOR HAVING WEAKLY PINNED FERROMAGNETIC LAYER

(75) Inventors: Sining Mao, Savage; Shouxiang Hu, Edina, both of MN (US)

(73) Assignee: Seagate Technology LLC, Scotts Valley, CA (US)

( * ) Notice: Under 35 U.S.C. 154(b), the term of this patent shall be extended for 0 days.

(21) Appl. No.: 09/154,437

(22) Filed: Sep. 16, 1998

Related U.S. Application Data

(60) Provisional application No. 60/089,003, filed on Jun. 11, 1998.

(51) Int. Cl.$^7$ .................................................. G11B 5/39
(52) U.S. Cl. ................................. 360/324.11; 360/324.12
(58) Field of Search ............................. 360/113, 324.11, 360/324.12

(56) References Cited

U.S. PATENT DOCUMENTS

| | | | |
|---|---|---|---|
| 4,949,039 | 8/1990 | Grünberg ........................... 324/252 |
| 5,206,590 | 4/1993 | Dieny et al. ....................... 324/252 |
| 5,475,304 | 12/1995 | Prinz ............................. 324/207.21 |
| 5,534,355 | 7/1996 | Okuno et al. ....................... 428/611 |
| 5,583,725 | 12/1996 | Coffey et al. ....................... 360/113 |
| 5,616,370 | 4/1997 | Okuno et al. ....................... 427/547 |
| 5,650,887 | 7/1997 | Dovek et al. ......................... 360/75 |
| 5,686,838 | 11/1997 | van den Berg ....................... 324/252 |
| 5,688,605 | 11/1997 | Iwasaki et al. ..................... 428/611 |
| 5,696,655 | 12/1997 | Kawano et al. ..................... 360/113 |
| 5,696,656 | 12/1997 | Gill et al. ......................... 360/113 |
| 5,702,832 | 12/1997 | Iwasaki et al. ..................... 428/611 |
| 5,705,973 | 1/1998 | Yuan et al. ......................... 338/32 R |
| 5,717,550 | 2/1998 | Nepela et al. ....................... 360/113 |
| 5,725,963 | 3/1998 | Iwasaki et al. ..................... 428/611 |
| 5,738,946 | 4/1998 | Iwasaki et al. ..................... 428/611 |
| 5,739,988 | 4/1998 | Gill ................................. 360/113 |
| 5,739,990 | 4/1998 | Ravipati et al. ..................... 360/113 |
| 5,742,162 | 4/1998 | Nepela et al. ....................... 324/252 |
| 5,748,524 | * 5/1998 | Chen et al. ......................... 365/173 |
| 5,751,521 | 5/1998 | Gill ................................. 360/113 |
| 5,756,191 | 5/1998 | Hashimoto et al. ................... 428/209 |
| 5,764,056 | * 6/1998 | Mao et al. ......................... 324/252 |
| 5,768,069 | 6/1998 | Mauri ............................... 360/113 |

FOREIGN PATENT DOCUMENTS 10-320717 * 12/1998 (JP) .
11-25430 * 1/1999 (JP) .

OTHER PUBLICATIONS

"Linearity of Unshielded Spin–Valve Sensors", by N. Sugaware et al., *American Institute of Physics*, 1997, 3 pages.
"AMR Effect in Spin–Valve Structure", by Y. Uehara et al., *IEEE Transactions on Magnetics*, vol. 32, No. 5, Sep. 1996, pp. 3432–3433.

* cited by examiner

*Primary Examiner*—Jefferson Evans
(74) *Attorney, Agent, or Firm*—Westman, Champlin & Kelly, P.A.

(57) ABSTRACT

The data storage system includes a storage medium having a data surface with data stored thereon, the stored data comprises variations in magnetic fields across the data surface. A slider is adapted to move across the data surface, the slider includes an air bearing surface (ABS) which is substantially parallel to the data surface. A current source provides a sense current (I) and readback circuitry is adapted to receive a readback signal and responsively provide a data output. A magnetoresistive sensor carried on the slider is adapted to receive the sense current (I), readback data from the data surface in response to variations in the magnetic field across the disc surface, and responsively provide the readback signal to the readback circuitry. The sensor is adapted to exhibit a GMR effect in response to a magnetic field. The sensor includes a free layer and a pinned layer each having respective quiescent magnetic field vectors. The magnetic field vectors of the free layer and the pinned layer both rotate in response to an applied magnetic field.

18 Claims, 2 Drawing Sheets

GIANT MAGNETORESISTIVE SENSOR HAVING WEAKLY PINNED FERROMAGNETIC LAYER

The present invention claims priority to Provisional Application Ser. No. 60/089,003, filed Jun. 11, 1998 and entitled IMPROVEMENT OF SENSITIVITY OF A SPIN VALVE HEAD USING BOTH FREE LAYER AND PINNED LAYER ROTATIONS.

BACKGROUND OF THE INVENTION

The present invention relates to data storage systems. More specifically, the present invention relates to data storage systems using read heads which utilize the giant magnetoresistive (GMR) effect.

Magnetic sensors utilizing the GMR effect, frequently referred to as "spin valve" sensors, are known in the art. A spin valve sensor is typically a sandwiched structure consisting of two ferromagnetic layers separated by a thin non-ferromagnetic layer. One of the ferromagnetic layers is called the "pinned layer" because it is magnetically pinned or oriented in a fixed and unchanging direction by an adjacent anti-ferromagnetic layer, commonly referred to as the "pinning layer," through anti-ferromagnetic exchange coupling. The other ferromagnetic layer is called the "free" or "unpinned" layer because the magnetization is allowed to rotate in response to the presence of external magnetic fields.

In a giant magnetoresistive sensor, a sense current is applied to the sensor. In the presence of a magnetic field such as that provided by magnetic storage medium, the resistance of the sensor changes resulting in a change in voltage due to the applied sense current. This voltage change may be measured and used to read back information. The operation of one configuration of a GMR sensor is described in U.S. Pat. No. 4,949,039, issued Aug. 14, 1990 to Grünberg, entitled "MAGNETIC FIELD SENSOR WITH FERROMAGNETIC THIN LAYERS HAVING MAGNETICALLY ANTIPARALLEL POLARIZED COMPONENTS".

The signal output from the GMR sensor is due to a change in conductance of the entire device which is dependent upon the relative alignment between the different magnetization vectors in the two ferromagnetic layers (the free layer and the pinned layer). A sufficient exchange coupling field (or pinning field) is required to keep the pinned layer's magnetization direction unchanged during operation of the GMR sensor. The sensitivity of the sensing layer is determined by the effective $H_k$ of the free layer in the sensor. However, when the stripe height is reduced, the sensitivity of the free layer decreases. One solution to this problem is to use an orthogonal GMR head design such as is described in U.S. Pat. No. 5,696,656 entitled HIGHLY SENSITIVE ORTHOGONAL SPIN VALVE READ HEAD by Gill issued Dec. 9, 1997. In the Gill design, the sense current is directed to flow away from the air bearing surface (ABS) and into the sensor. Since the stripe is now high in this configuration, the demagnetization field is reduced and the sensitivity remains high. However, the metal contact at the air bearing surface reduces the efficiency of the sensor. A complicated flux guide is required in such a design to enhance sensor efficiency and overcome the decrease in sensitivity due to the metal contact.

SUMMARY OF THE INVENTION

A data storage system includes a storage medium having a data surface with data stored thereon, the stored data comprises variations in magnetic fields across the data surface. A slider is adapted to move across the data surface, the slider includes an air bearing surface (ABS) which is substantially parallel to the data surface. A current source provides a sense current (I) and readback circuitry is adapted to receive a readback signal and responsively provide a data output. A magnetoresistive sensor carried on the slider is adapted to receive the sense current (I), readback data from the data surface in response to variations in the magnetic field across the disc surface, and responsively provide the readback signal to the readback circuitry. The sensor is adapted to exhibit a GMR effect in response to a magnetic field. The sensor includes a free layer and a loosely pinned layer. The free layer and the loosely pinned layer each having respective quiescent magnetic field vectors. The magnetic field vectors of the free and loosely pinned layers both rotate in response to an applied magnetic field. In one embodiment, the loosely pinned layer is weakly pinned by an anti-ferromagnetic layer. In another embodiment, two ferromagnetic layers are used having a quiescent bias points which are loosely pinned about 90° apart.

DETAILED DESCRIPTION OF THE PREFERRED EMBODIMENTS

Figure 1:
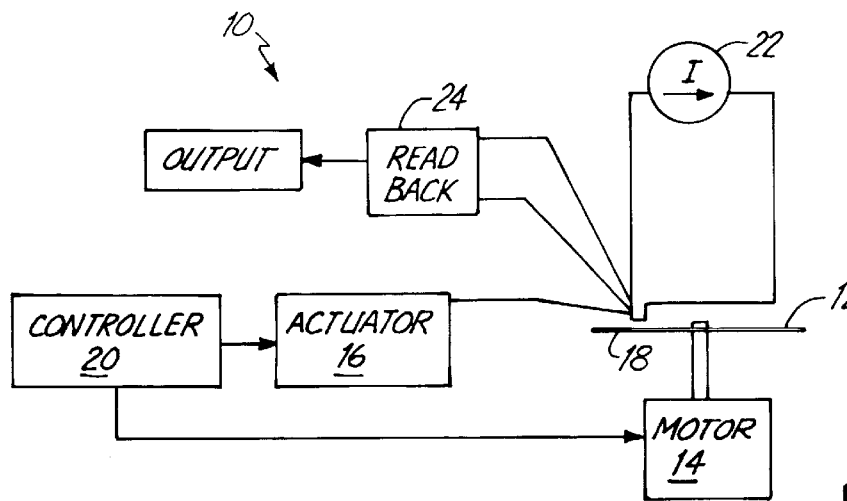
FIG. 1 is a simplified diagram of a storage system in accordance with the present invention.

The present invention relates to magnetoresistive sensors of the giant magnetoresistive (GMR or spin valve) type which are used to read back information from storage media such as magnetic discs. One aspect of the present invention includes the use of rotation of two ferromagnetic layers having quiescent bias points approximately 90° apart. Further, the magnetic vector in the "pinned" layer of a GMR sensor may be used to enhance the GMR effect and thereby increase sensitivity of the sensor.

One type of magnetoresistive sensor is described in U.S. Pat. No. 4,949,039, issued Aug. 14, 1990 to Grünberg, entitled "MAGNETIC FIELD SENSOR WITH FERROMAGNETIC THIN LAYERS HAVING MAGNETICALLY ANTIPARALLEL POLARIZED COMPONENTS" which is hereby incorporated by reference. The device shown in the Grünberg patent is known as a "spin valve" (SV) or giant magnetoresistive (GMR) sensor which is typically a sandwiched structure consisting of two ferromagnetic layers separated by a thin nonmagnetic layer (e.g., Cu). One of the ferromagnetic layers is called the "pinned layer" that is magnetically oriented in a fixed and unchanged direction by an adjacent antiferromagnetic layer (which is called the "pinning layer") through an antiferromagnetic exchange coupling. The other ferromagnetic layer is called the "free" layer in which the magnetization rotates in response to an external magnetic field, while the pinned layer's magnetization is not free to rotate. The signal results from the change of the conductance of the whole device, which depends on the relative alignment between the different magnetization in the two ferromagnetic layers. A sufficient exchange coupling field (or pinning field) is required to keep the pinned layer's magnetization unchanged during the operation of the GMR/SV sensor. The sensitivity of the sensing layer is determined by the effective $H_k$ of the free layer in the sensor. When the stripe height is reduced the sensitivity of the free layer decreases.

A solution to this problem is to use the orthogonal GMR head described in Gill, U.S. Pat. No. 5,696,656 entitled HIGHLY SENSITIVE ORTHOGONAL SPIN VALVE READ HEAD issued Dec. 9, 1997 incorporated herein by reference. In the Gill patent, the current flows from the air bearing surface (ABS) in a direction away from the ABS and into the sensor. Since the stripe height is now high, the demagnetization field is reduced and the sensitivity of the head is high. However, the Gill design requires a metal contact at the air bearing surface which significantly reduces the readback efficiency of the sensor. Complex flux guides are required to enhance the sensor efficiency.

The present invention includes the recognition that it is the relative relationship between the magnetic vectors of the ferromagnetic layers such as the free layer and the "pinned layer" which is utilized in sensor operation. The present invention further recognizes that the magnetic vectors of both the free layer and the "pinned layer" may be allowed to change in order to enhance sensor sensitivity. For example, if the exchange pinning field from the antiferromagnetic (AMF) layer is sufficiently weak, the "pinned" ferromagnetic layer can rotate along the hard axis direction under the influence of the external magnetic field. For example, an IrMn antiferromagnetic layer will allow rotation in a "pinned" NiFe "pinned" layer. The giant magnetoresistive effect is determined only by the relative angle between the two magnetization vectors. Rotation of either the free layer or the "pinned" layer will generate the same GMR effect. Further, in another embodiment two free layers are provided. In the present invention, the magnetization vectors of both layers are allowed to rotate to thereby enhance sensor sensitivity.

The present invention includes a new spin valve sensor which may be used in a data storage system such as data storage system 10 shown in FIG. 1. System 10 includes storage medium 12 such as a magnetic disc which is rotated by motor 14. An actuator 16 is coupled to a slider 18 which is used to position a magnetoresistive sensor (not shown in FIG. 1) over a surface of disc 12. A controller 20 controls positioning of slider 18. The magnetoresistive sensor operates by receiving a sense (or bias) current I from current source 22. Variations in a magnetic field applied to the magnetoresistive sensor due to magnetization of disc 12 cause a change in the electrical resistance of the sensor. This change in electrical resistance is detected with readback circuitry 24 which responsively provides data output.

Figure 2:
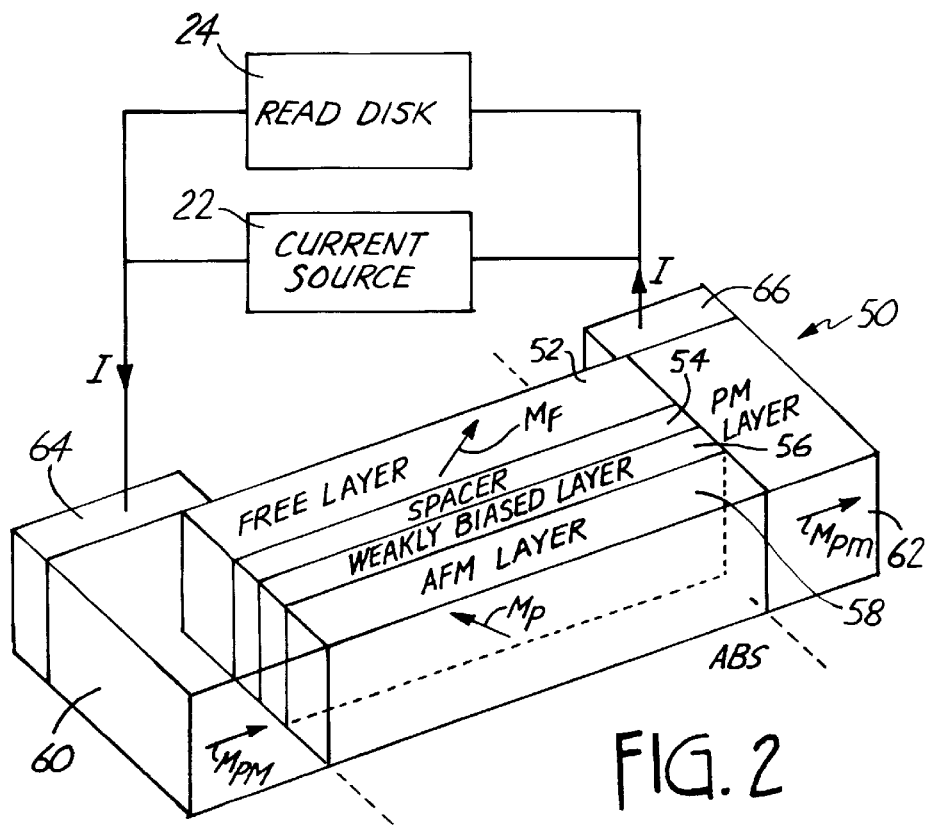
FIG. 2 is a simplified diagram of a magnetoresistive sensor for use with the storage system of FIG. 1 in accordance with one embodiment of the present invention.

FIG. 2 is a simplified perspective view of a spin valve 50 in accordance with one embodiment of the present invention. Spin valve 50 includes free layer 52, spacer 54, weakly biased pinned layer 56, antiferromagnetic (AFM) pinning layer 58, permanent magnets 60 and 62 and electrical contacts 64 and 66. The various layers of spin valve 50 may comprise any appropriate material to achieve desired spin valve characteristics. FIG. 2 also shows the positioning of the air bearing surface (ABS) relative to sensor 50. The free layer quiescent magnetization direction as indicated by the label labelled $M_F$ and the "pinned" layer quiescent magnetization direction as indicated by arrow $M_P$. Permanent magnets 60 and 62 provide a magnetic field $M_{PM}$ as indicated in FIG. 2 for biasing sensor 50.

In the embodiment of FIG. 2, "pinned" layer 56 is only weakly biased in the direction $M_P$. This is preferably about 90° relative to $M_F$ of free layer 52. The weak biasing of layer 56 may be achieved, for example, using a weak exchange pinning field from AFM layer 58. For example, if layer 58 comprises NiMn and layer 56 comprises NiFe, $M_P$, of layer 56 can easily rotate in the presence of an applied field being sensed. Thus, the GMR effect in sensor 50 is determined by the relative angle between $M_F$ and $M_P$. Since both $M_F$ and $M_P$ rotate in the presence of an external magnetic field, the performance of sensor 50 will be enhanced over prior art designs. In sensor 50, $M_P$ is approximately 45° relative to the air bearing surface of the sensor. $M_F$ of free layer 52 is also approximately 45° relative to the ABS, but having a component parallel with the ABS which is perpendicular to the component of $M_P$ which is parallel with the ABS whereby the relative angle between $M_F$ and $M_P$ is approximately 90°. The biasing sensor 50 is achieved due to the bias field provided by permanent magnet 60 and 62 in the field generated by sense current I.

Figure 3:
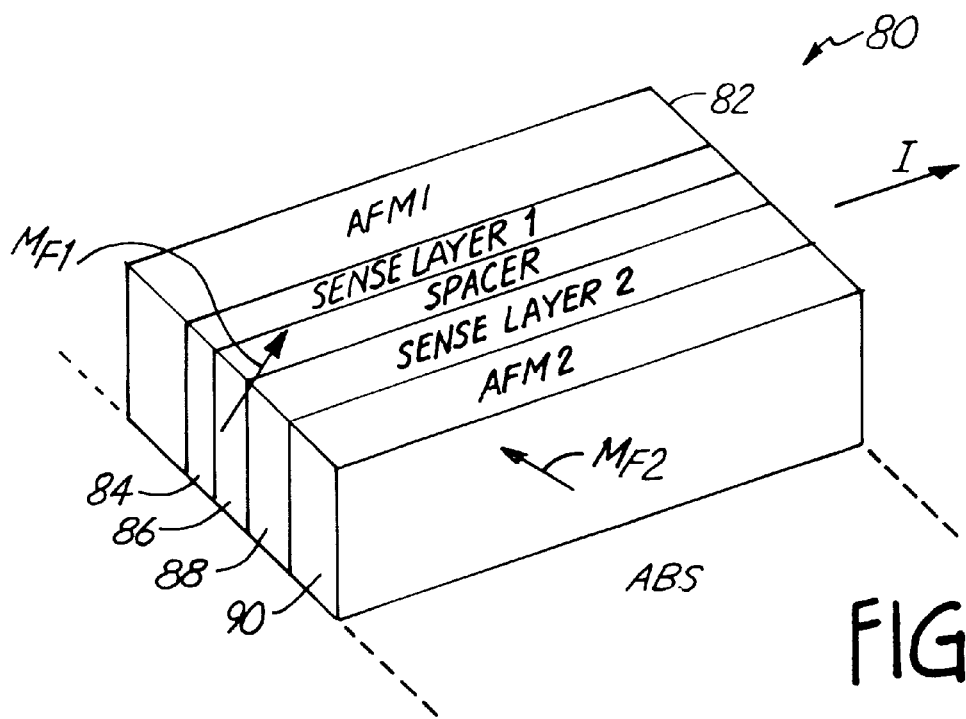
FIG. 3 is a simplified diagram of a magnetoresistive sensor for use with the storage system of FIG. 1 in accordance with another embodiment of the present invention.
Figure 4:
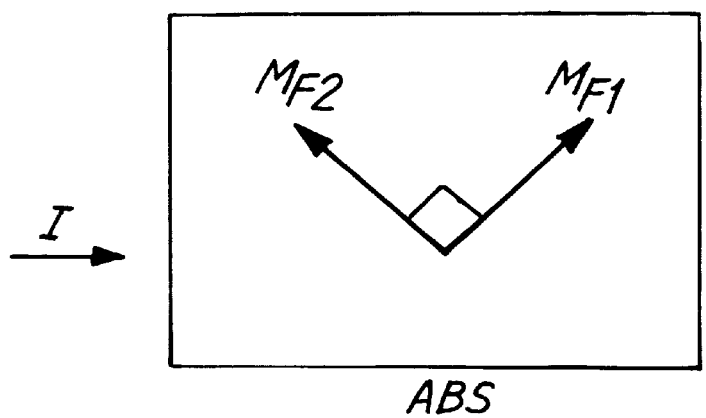
FIG. 4 is a diagram showing magnetization vectors of two layers in the magnetoresistive sensor of FIG. 3.

FIG. 3 is a simplified perspective view of sensor 80 in accordance with another embodiment. Sensor 80 does not require permanent magnets for biasing. Sensor 80 includes a first antiferromagnetic layer 82, a first sense layer 84, a spacer 86, a second sense layer 88 and second antiferromagnetic layer 90. Layer 84 includes a quiescent magnetization vector $M_{F1}$ and sense layer 88 includes a quiescent magnetization $M_{F2}$. Layer 82 is used to weakly "pin" sense layer 84 and layer 90 is used to weakly "pin" sense layer 88. Additionally, the sense current I biases layers 84 and 88. FIG. 3 is a vector diagram showing the relative orientation of $M_{F1}$, $M_{F2}$ and I. $M_{F1}$ is biased by layer 82 to an angle of 135° relative to the air bearing surface (ABS). Sense layer 88 is biased at an angle of 45° relative to the ABS by layer 90. Thus, in the quiescent state, a substantially 90° angle is formed between $MF_1$ and $M_{F2}$. In the presence of an applied magnetic field, both $M_{F1}$, and $M_{F2}$ of sense layers 84 and 88 rotate about their quiescent bias point thereby enhancing the sensitivity of the sensor 80.

The present invention is easily implemented using current spin valve designs and provides increased sensitivity over the prior art. The various layers disclosed herein may be of any material as desired such that the structure provides a GMR effect. The invention is particularly advantageous for high area density recording applications.

Although the present invention has been described with reference to preferred embodiments, workers skilled in the art will recognize that changes may be made in form and detail without departing from the spirit and scope of the invention.

What is claimed is:

1. A spin valve/GMR sensor for receiving a sense current (I) and having a voltage drop which changes in response to an applied magnetic fields, comprising:
   a first ferromagnetic layer having a magnetization vector ($M_1$) with a vector component in a quiescent state about 45° to the sense current (I);
   a second ferromagnetic layer having a magnetization vector ($M_2$) with a vector component in a quiescent state about 45° to the sense current (I) and having a component perpendicular to $M_1$;
   a first antiferromagnetic layer weakly biasing $M_1$ of the first ferromagnetic layer in a direction with a vector component in a quiescent state about 45° to the sense current (I) with an applied field having a field strength at the first ferromagnetic layer sufficiently small to allow rotation of the magnetization vector $M_1$ in response to an applied magnetic field; and wherein $M_1$ and $M_2$ rotate about their respective quiescent bias points in response to an applied magnetic field and a GMR effect in the sensor is a function of the rotation of both $M_1$ and $M_2$.

2. The sensor of claim 1 including at least one permanent magnet to bias $M_1$ and $M_2$.

3. The sensor of claim 1 including a second antiferromagnetic layer weakly pinning the second ferromagnetic layer.

4. The sensor of claim 1 wherein the first antiferromagnetic layer comprises IrMn.

5. The sensor of claim 1 wherein the first ferromagnetic layer comprises NiFe.

6. The sensor of claim 1 wherein $M_2$ is substantially perpendicular to $M_2$.

7. A storage system, comprising:
    a storage medium having a data surface with data stored thereon, the stored data comprising variations in magnetic field across the data surface;
    a slider adapted to move across the data surface, the slider having an air bearing surface (ABS) substantially parallel to the data surface;
    a current source providing the sense current (I);
    readback circuitry adapted to receive a readback signal and responsively provide a data output;
    the spin valve/GMR sensor of claim 1 carried on the slider adapted to receive the sense current in a sense current direction, read data from the data surface in response to variations in the magnetic field across the disc surface, and responsively provide the readback signal to the readback circuitry.

8. The storage system of claim 7 wherein the sense current (I) is directed through the sensor in a direction substantially parallel with the air bearing surface of the slider.

9. The storage system of claim 8 wherein $M_1$ is about 45° relative to the air bearing surface of the slider.

10. The storage system of claim 8 wherein $M_2$ is about 45° relative to the air bearing surface of the slider.

11. A magnetic data storage system including a spin valve/GMR sensor in accordance with claim 1.

12. A storage system, comprising:
    a storage medium configured to store information;
    a giant magnetoresistive sensor configured to read information from the storage medium, the sensor including first and second ferromagnetic layers having respective quiescent magnetization vectors $M_1$ and $M_2$ arranged at generally 45° relative to a direction of a sense current through the sensor and an antiferromagnetic means for weakly biasing the magnetization vector $M_1$ of the first ferromagnetic layer in a direction with a vector component in a quiescent state about 45° to the sense current (I) with an applied field having a field strength at the first ferromagnetic layer sufficiently small to allow rotation of the magnetization vector $M_1$ in response to an applied magnetic field.

13. A method of sensing an applied magnetic field, comprising:
    providing a first ferromagnetic layer having a magnetization vector ($M_1$) having a vector component in a quiescent state about 45° to a sense current (I);
    providing a second ferromagnetic layer having a magnetization vector ($M_2$) having a vector component in a quiescent state about 45° perpendicular to the sense current (I) and having a component perpendicular to $M_1$;
    providing a first antiferromagnetic layer weakly biasing $M_1$ of the first ferromagnetic layer in a direction with a vector component in a quiescent state about 45° to the sense current (I) with an applied field having a field strength at the first ferromagnetic layer sufficiently small to allow rotation of the magnetization vector $M_1$ in response to an applied magnetic field; and
    allowing $M_1$ and $M_2$ rotate about their respective quiescent bias points in response to an applied magnetic field whereby a GMR effect in the sensor is a function of the rotation of both $M_1$ and $M_2$.

14. The method of claim 13 includes biasing $M_1$ and $M_2$ with at least one permanent magnet.

15. The method of claim 13 including weakly biasing the second ferromagnetic layer.

16. The method of claim 13 wherein the sensor is carried on a slider having an air bearing surface and the sense current (I) is directed through the sensor in a direction substantially parallel with the air bearing surface of the slider.

17. The method of claim 16 wherein $M_1$ is about 45° relative to the air bearing surface of the slider.

18. The method of claim 16 wherein $M_2$ is about 45° relative to the air bearing surface of the slider.

* * * * *

UNITED STATES PATENT AND TRADEMARK OFFICE
CERTIFICATE OF CORRECTION

PATENT NO. : 6,169,647 B1
DATED : January 2, 2001
INVENTOR(S) : Sining Mao et al.

Page 1 of 1

It is certified that error appears in the above-identified patent and that said Letters Patent is hereby corrected as shown below:

Column 3,
Line 30, delete the second occurrence of "pinned".

Column 5,
Line 27, delete "of claim 1".

Signed and Sealed this

Twenty fifth Day of September, 2001

Attest:

*Attesting Officer*

NICHOLAS P. GODICI
*Acting Director of the United States Patent and Trademark Office*

UNITED STATES PATENT AND TRADEMARK OFFICE
CERTIFICATE OF CORRECTION

PATENT NO.    : 6,169,647 B1
DATED         : January 2, 2001
INVENTOR(S)   : Sining Mao et al.

It is certified that error appears in the above-identified patent and that said Letters Patent is hereby corrected as shown below:

Column 3,
Line 30, delete the second occurrence of "pinned".

Column 5,
Line 27, delete "of claim 1".

Signed and Sealed this

First Day of January, 2002

*Attest:*

*Attesting Officer*

JAMES E. ROGAN
*Director of the United States Patent and Trademark Office*